United States Patent [19]

Parkinson et al.

[11] Patent Number: 5,532,617

[45] Date of Patent: Jul. 2, 1996

[54] CMOS INPUT WITH TEMPERATURE AND $V_{CC}$ COMPENSATED THRESHOLD

[75] Inventors: Thomas D. Parkinson; Brian C. Martin, both of Albuquerque, N.M.

[73] Assignee: Philips Electronics North America Corporation, New York, N.Y.

[21] Appl. No.: 218,487

[22] Filed: Mar. 25, 1994

[51] Int. Cl.[6] .................. H03K 17/16; H03K 19/003
[52] U.S. Cl. .................. 326/32; 326/33; 326/121; 327/543
[58] Field of Search .................. 307/443, 451, 307/310, 296.8, 296.7; 326/32, 33, 34, 121; 327/512, 543, 542

[56] References Cited

U.S. PATENT DOCUMENTS

| | | | |
|---|---|---|---|
| 4,499,416 | 2/1985 | Koike | 323/303 |
| 4,740,717 | 4/1988 | Fletcher et al. | |
| 4,894,561 | 1/1990 | Nogami | 307/443 |
| 4,929,853 | 5/1990 | Kim et al. | 307/475 |
| 4,956,567 | 9/1990 | Hunley et al. | 307/310 |
| 4,999,529 | 3/1991 | Morgan, Jr. et al. | 307/475 |
| 5,220,205 | 6/1993 | Schigehara | 307/272.2 |
| 5,291,071 | 3/1994 | Allen et al. | 307/270 |
| 5,296,754 | 3/1994 | Yoshinaga | 307/443 |
| 5,495,187 | 2/1996 | Martin | 326/33 |

FOREIGN PATENT DOCUMENTS

| | | |
|---|---|---|
| 58-59628 | 4/1983 | Japan. |
| 141521 | 2/1989 | Japan. |
| 2161817 | 6/1990 | Japan. |
| 529910 | 2/1993 | Japan. |

*Primary Examiner*—Edward P. Westin
*Assistant Examiner*—Stephen Calogero
*Attorney, Agent, or Firm*—David Schreiber

[57] ABSTRACT

A CMOS inverter circuit is provided which includes a compensation circuit which modifies the inverter threshold depending on changes in supply voltage and/or temperature. The inverter includes a standard CMOS inverter, current boosting circuitry and a reference signal generator. The input of the inverter is coupled to the current boosting circuitry. A reference signal is also coupled to the current boosting circuitry in order to change the effective PMOS to NMOS ratio of the inverter to control the input threshold over a range of supply voltages and/or temperatures. The reference signal generator generates a reference signal which is dependent upon changes in supply voltage and which can be controlled over a range of temperatures.

10 Claims, 2 Drawing Sheets

CMOS INPUT WITH TEMPERATURE AND $V_{CC}$ COMPENSATED THRESHOLD

CROSS-REFERENCE TO RELATED APPLICATIONS

A commonly owned, copending application entitled "CMOS INPUT WITH $V_{cc}$ COMPENSATED DYNAMIC THRESHOLD", now U.S. Pat. No. 5,495,187.

BACKGROUND OF THE INVENTION

This invention relates to a CMOS inverter circuit and more particularly to a CMOS inverter including a compensation circuit which adjusts the inverter's input threshold to stabilize it over a range of $V_{cc}$ and temperature.

A conventional CMOS inverter 10 is shown in FIG. 1. Inverter 10 includes a pMOS transistor 12 and a nMOS transistor 14. A gate 12g of pMOS transistor is coupled to a gate 14g of nMOS transistor 14. A first flow electrode 12s of transistor 12 is coupled to $V_{cc}$ and a first flow electrode 14s of transistor 14 is coupled to ground. A second flow electrode 12d of transistor 12 is coupled to a second flow electrode 14d of transistor 14. The switching threshold of inverter 10 is dependent on the relative size of transistors 12 and 14 and the supply voltage $V_{cc}$. The higher the ratio of pMOS to nMOS, the higher the input threshold. If we assume for a typical circuit that the input threshold is $V_{cc}/2$ and that $V_{cc}$ is allowed to vary from 2.7 to 3.6 volts, the input threshold could then vary from 1.35 to 1.8 volts. This is undesirable, for example, if the input of inverter 10 is a clock pulse specified to ramp from 2.7 to 0 volts with a 2.5 ns slew rate and the design requires the propagation time of the clock signal to be independent of $V_{cc}$.

In addition, changes in temperature can change the effective size of the transistors in the inverter which results in changes in the switching threshold.

Accordingly, it would be desirable to provide a CMOS inverter including circuitry which could maintain the switching threshold as $V_{cc}$ and temperature vary.

Also, because subsequent circuits may also vary with changes in $V_{cc}$ and temperature, it would be desirable to have an input threshold which changes in a compensating manner with $V_{cc}$ and temperature.

SUMMARY OF THE INVENTION

It is thus an object of the invention to provide a CMOS inverter having compensation circuitry which is capable of compensating for the input threshold over a predetermined range of $V_{cc}$ by modifying the ratio of PMOS to NMOS as the supply voltage changes.

It is a further object of the invention to provide an inverter circuit in which varying temperature effects on the switching threshold can be controlled.

It is another object of the invention to provide an inverter circuit having an input threshold which varies inversely with $V_{cc}$.

In accordance with the invention, these objects are achieved by a new inverter structure which includes an inverter and circuitry for controlling the input threshold of the inverter.

In accordance with the invention, these objects are achieved by a new inverter which includes an inverting circuit and current boosting circuitry.

In a preferred embodiment, the current boosting circuitry receives a reference signal and the inverter input signal as inputs and when activated increases the effective nMOS size of the inverter. The current boosting circuitry includes two nMOS transistors coupled in serial. The main current path of the transistors is coupled between the output of the inverting circuit and a voltage supply. The gate of one of the transistors receives a reference signal which is directly related to the value of $V_{cc}$. When the reference signal exceeds a predetermined value, the current boosting circuitry begins to turn on thus increasing the effective nMOS size in the inverter.

In the preferred embodiment, a reference signal generating circuit is included to generate a reference signal which can be controlled depending on changes in $V_{cc}$ and temperature.

Still other objects and advantages of the invention will in part be obvious and will in part be apparent from the specification.

The invention accordingly comprises the features of construction, combination of elements and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENT

Figure 1:
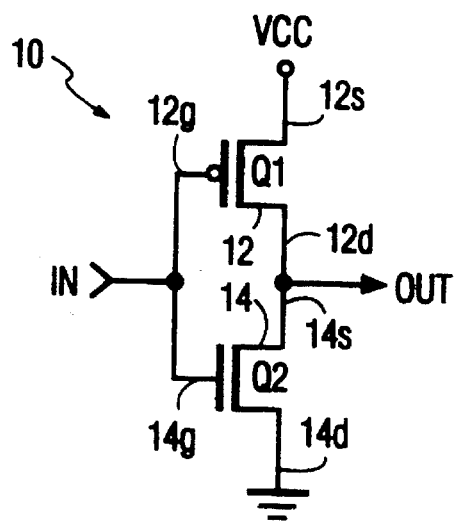
FIG. 1 is a circuit diagram of a CMOS inverter in accordance with the prior art.
Figure 2:
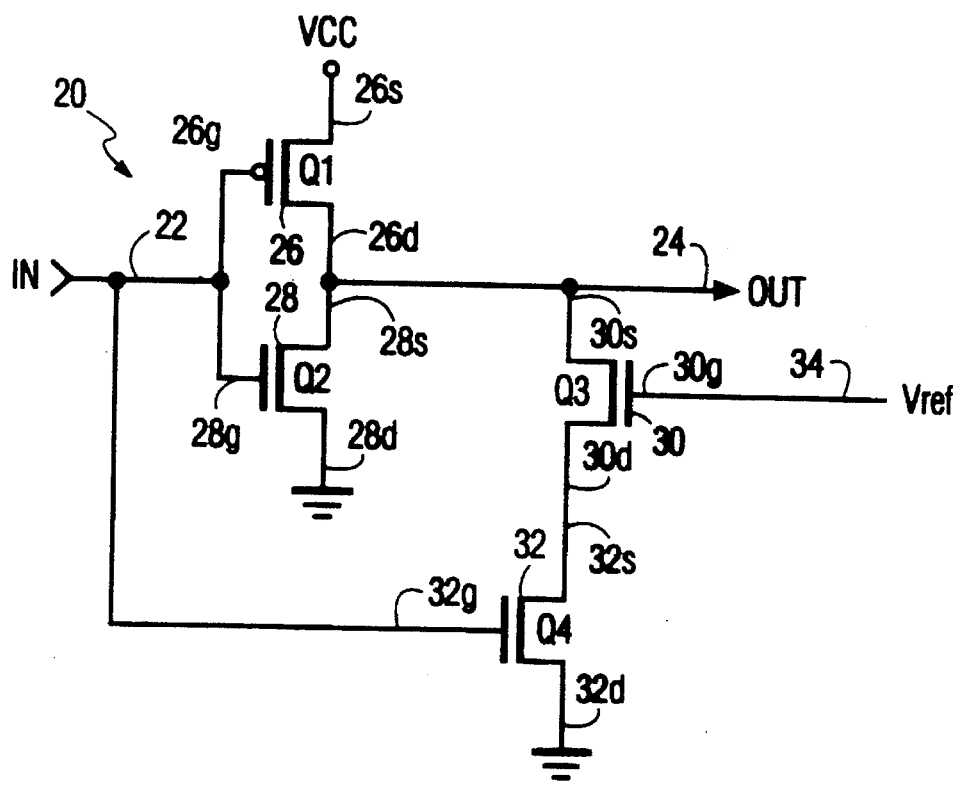
FIG. 2 is a circuit diagram of a CMOS inverter in accordance with a first embodiment of the invention.

Reference is had to FIG. 2 which depicts a CMOS inverter in accordance with the preferred embodiment of the present invention. An inverter 20 is operable from a first voltage supply $V_{cc}$ to a second voltage supply, for example ground, and has an input terminal 22 and an output terminal 24. Inverter 20 includes a first pMOS transistor 26 and a first nMOS transistor 28. pMOS transistor 26 has a gate 26g coupled to input terminal 22, a source 26s coupled to $V_{cc}$ and a drain 26d. nMOS transistor 28 has a gate 28g coupled to gate 26g, a source 28s coupled to drain 26d and a drain 28d coupled to ground.

Inverter 20 also includes a second nMOS transistor 30 and a third nMOS transistor 32. Second nMOS transistor 30 includes a source 30s coupled to output terminal 24, a gate 30g coupled to a reference voltage supply terminal 34 and a drain 30d. Reference signal $V_{ref}$ present at reference signal supply terminal 34 is dependent on $V_{cc}$. Third nMOS transistor 32 includes a source 32s coupled to drain 30d, a gate 30g coupled to input terminal 22 and a drain 32d coupled to ground.

Since $V_{ref}$ is dependent on $V_{cc}$, the voltage at gate 30g increases when $V_{cc}$ increases. This voltage increase allows more current to flow through second nMOS transistor 30 thus increasing the effective size of the NMOS in inverter 20. Thus as $V_{cc}$ increases, the tendency of the threshold to increase with $V_{cc}$ is compensated for by the decrease in threshold associated with the larger effective nMOS size. By properly adjusting $V_{ref}$ and the sizes of first nMOS transistor 26, first pMOS transistor 28 and second nMOS transistor 30, the change in threshold of inverter 20 as a result in a change in $V_{cc}$ can be controlled. In fact, the threshold can be made to increase, remain constant or decrease with increasing $V_{cc}$.

Third nMOS transistor 32 is included to allow inverter 20 to operate with zero static power. When the voltage at input terminal 22 is at a high logic level, third nMOS transistor 32 will turn on. Since output terminal 24 will be at a low logic level, no current will flow, Likewise, when the voltage at input terminal 22 is at a low logic level, output terminal is at $V_{cc}$, but the voltage at input terminal 22 will turn off third nMOS transistor 32 so that no current path exists from $V_{cc}$ to ground. Third nMOS transistor 32 should be made large enough so that the current that flows through second nMOS transistor 30 and third nMOS transistor 32 is controlled by the voltage at gate 30g.

Figure 3:
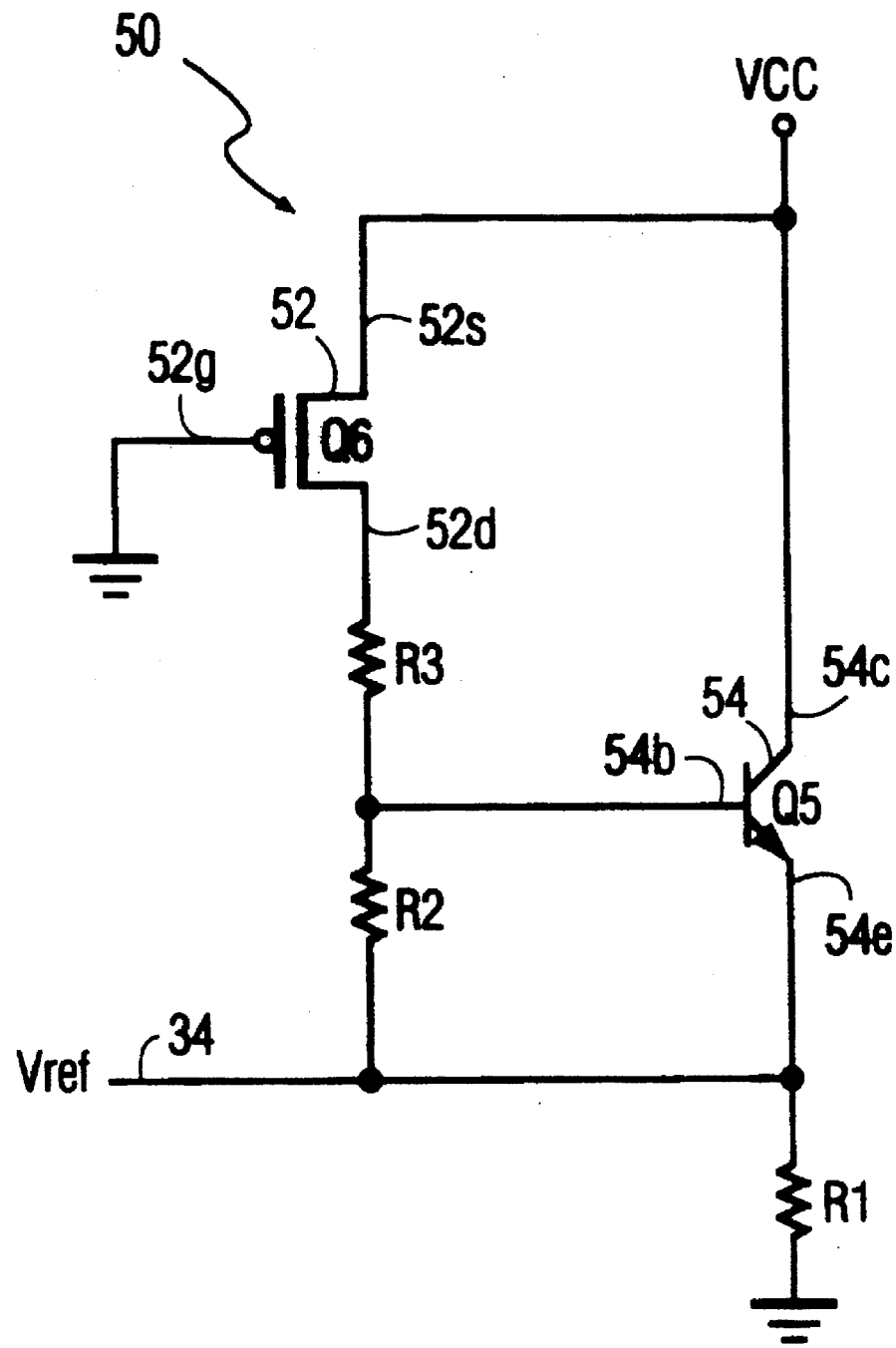
FIG. 3 is a circuit diagram of a reference signal circuit utilized in the CMOS inverter of FIG. 2.

There are several ways to supply $V_{ref}$ to reference signal terminal 34. If it is desired to maintain a constant switching threshold with changes in temperature, a bandgap reference can be utilized to supply $V_{ref}$. If, however, it is desired to control the threshold with changes in temperature or changes in $V_{cc}$ to compensate for $V_{cc}$ and/or temperature effects in subsequent circuits, a reference circuit, such as the one shown in FIG. 3, can be used.

Reference signal circuit 50 includes pMOS transistor 52 and a bipolar transistor 54. pMOS transistor 52 has a gate 52g coupled to ground, a source 52s coupled to $V_{cc}$ and a drain 52d. Bipolar transistor 54 includes a collector 54c coupled to $V_{cc}$, a base 54b and an emitter 54e. Circuit 50 also includes a resistor R3 is coupled between drain 52d and base 54b, a resistor R2 coupled between base 54b and reference signal terminal 34 and a resistor R1 coupled between emitter 54e and ground.

Resistor R1 is used to control the amount of static current used by the reference circuit. Typically, the static current allowed is very limited. Transistors 52 and 54 and resistors R2 and R3 form a $V_{be}$ multiplier so that the voltage drop from $V_{cc}$ to $V_{ref}$ is some multiple of the base-to-emitter voltage of transistor 54. The value of the multiplier is dependent on the ratio of the resistance of resistor R3 and transistor 52 to resistor R2. As the temperature increases, the base-to-emitter voltage of transistor 54 will decrease, while the effective resistance of transistor 52 will increase. The increase of the effective resistance of transistor 52 will increase the multiplier and compensate for the decrease in $V_{be}$ of transistor 54. By controlling the relative sizes of resistors R2 and R3 and transistor 52, the change in $V_{ref}$ with temperature can be controlled. Since the value of $V_{ref}$ is directly related to the switching threshold of inverter 20, circuit 50 allows the effects of temperature on the switching threshold to be controlled. Therefore the switching threshold of inverter 20 can be controlled for changes in $V_{cc}$ and temperature.

In addition, as $V_{cc}$ increases, the gate-to-source voltage on transistor 52 increases, turning transistor 52 on harder and therefore reducing its effective resistance. The voltage drop across the $V_{be}$ multiplier therefore decreases, the potential of $V_{ref}$ increases, and the effects of transistor 30 on the input threshold increases. The inverter threshold of inverter 20 can thus decrease as $V_{cc}$ increases by sizing transistors transistor 30 and transistor 52 accordingly.

It will thus be seen that the objects set forth above among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A logic circuit operable between a first voltage supply and a second voltage supply and having an input terminal for receiving an input signal and an output terminal for outputting an output signal, comprising:

inverting means for receiving the input signal, inverting the input signal and outputting the inverted input signal, said inverting means having a predetermined switching threshold;

current boosting means for changing the predetermined switching threshold of the inverting means during operation responsive to a predetermined reference signal; and reference signal generating means responsive to changes in the first voltage supply for generating the predetermined reference signal, said reference signal generating means including a bipolar transistor, said bipolar transistor having a base, emitter and collector and multiplying means for generating the reference signal equal to a multiple of a voltage potential between the base and the emitter of the bipolar transistor.

2. The logic of claim 1, wherein the multiplying means includes a transistor having its control electrode coupled to a constant voltage source and a main current path coupled between the first voltage supply and the base of the bipolar transistor.

3. The logic of claim 2, wherein the multiplying means includes a first resistor coupled between the reference signal terminal and the base of the bipolar transistor and a second resistor coupled between the base of the bipolar transistor and the drain of the transistor.

4. The inverter of claim 3, wherein the reference signal generating means includes a third resistor coupled between the reference signal terminal and the second voltage supply.

5. The logic of claim 3, wherein the transistor is a pMOS transistor.

6. The logic of claim 3, wherein the transistor is a nMOS transistor.

7. An inverter circuit operable between a first voltage supply and a second voltage supply and having an input terminal for receiving an input signal and an output terminal for outputting an output signal, comprising:

inverting means for receiving the input signal, inverting the input signal and outputting the inverted input signal, said inverting means having a predetermined switching threshold; and current boosting means for changing the predetermined switching threshold of the inverting means in response to a predetermined reference signal; and reference signal generating means responsive to changes in the first voltage supply for generating the predetermined reference signal;

the current boosting means including a first transistor and a second transistor, the first transistor having a control electrode coupled to the reference signal terminal, the second transistor having a control electrode coupled to the input terminal, the first and second transistors connected serially so that a main current path is coupled between the output terminal and the second voltage supply;

the reference signal generating means including a bipolar transistor, said bipolar transistor having a base, emitter and collector and multiplying means for generating the reference signal equal to a multiple of a voltage potential between the base and the emitter of the bipolar transistor.

8. The logic of claim 7, wherein the multiplying means includes a transistor having its control electrode coupled to a constant voltage source and a main current path coupled between the first voltage supply and the base of the bipolar transistor.

9. The logic of claim 8, wherein the multiplying means includes a first resistor coupled between the reference signal terminal and the base of the bipolar transistor and a second resistor coupled between the base of the bipolar transistor and the drain of the transistor.

10. The logic of claim 9, wherein the reference signal generating means includes a third resistor coupled between the reference signal terminal and the second voltage supply.

* * * * *